(12) United States Patent
Hu (10) Patent No.: US 10,643,936 B2
(45) Date of Patent: May 5, 2020

(54) PACKAGE SUBSTRATE AND PACKAGE STRUCTURE

(71) Applicant: Dyi-Chung Hu, Hsinchu (TW)

(72) Inventor: Dyi-Chung Hu, Hsinchu (TW)

( * ) Notice: Subject to any disclaimer, the term of this patent is extended or adjusted under 35 U.S.C. 154(b) by 0 days.

(21) Appl. No.: 15/842,816

(22) Filed: Dec. 14, 2017

(65) Prior Publication Data

US 2018/0350731 A1 Dec. 6, 2018

Related U.S. Application Data

(60) Provisional application No. 62/512,731, filed on May 31, 2017.

(51) Int. Cl.
*H01L 23/498* (2006.01)
*H01L 21/48* (2006.01)
*H01L 21/683* (2006.01)
*H01L 23/31* (2006.01)

(52) U.S. Cl.
CPC .... *H01L 23/49822* (2013.01); *H01L 21/4857* (2013.01); *H01L 21/6835* (2013.01); *H01L 23/49838* (2013.01); *H01L 23/49894* (2013.01); *H01L 23/3128* (2013.01); *H01L 23/49816* (2013.01); *H01L 23/49827* (2013.01); *H01L 2221/68345* (2013.01); *H01L 2224/16225* (2013.01); *H01L 2924/15311* (2013.01)

(58) Field of Classification Search
CPC ......... H01L 23/49822; H01L 23/49838; H01L 23/5383; H01L 23/5386; H01L 21/4857; H01L 21/76804; H01L 23/498; H01L 23/49827; H01L 23/49833; H05K 3/4688; H05K 3/4644; H05K 1/0271; H05K 1/0298; H05K 3/4602
See application file for complete search history.

(56) References Cited

U.S. PATENT DOCUMENTS

| | | | | |
|---|---|---|---|---|
| 4,446,477 A * | 5/1984 | Currie | ................. | H01L 23/055 257/697 |
| 4,811,082 A * | 3/1989 | Jacobs | ................. | H01L 23/538 174/261 |
| 5,162,240 A * | 11/1992 | Saitou | ................. | H01L 21/4857 257/E23.173 |
| 6,355,567 B1 * | 3/2002 | Halle | ................. | H01L 21/76804 257/E21.252 |
| 6,960,504 B2 * | 11/2005 | Park | ................. | H01L 21/31111 257/E21.019 |

(Continued)

*Primary Examiner* — David A Zarneke
(74) *Attorney, Agent, or Firm* — JCIPRNET (57) ABSTRACT

A package substrate including a fine redistribution circuitry, a first redistribution circuitry disposed on the fine redistribution circuitry and a core disposed on the first redistribution circuitry opposite to the fine redistribution circuitry. The fine redistribution circuitry includes a fine conductive pattern. The first redistribution circuitry includes a first conductive pattern electrically connected to the fine conductive pattern. A thickness of the fine redistribution circuitry is less than a thickness of the first redistribution circuitry and a dimension of the fine conductive pattern is less than a dimension of the first conductive pattern. The core is electrically connected to the first conductive pattern. The Young's modulus of the core is greater than the Young's modulus of the first redistribution circuitry. A package structure is also provided.

18 Claims, 5 Drawing Sheets

(56) References Cited

U.S. PATENT DOCUMENTS

| | | | |
|---|---|---|---|
| 8,129,823 B2* | 3/2012 | Tanikella | H01L 21/4857 |
| | | | 257/643 |
| 8,373,069 B2* | 2/2013 | Kariya | H01L 21/486 |
| | | | 174/255 |
| 8,946,884 B2* | 2/2015 | Kwon | H01L 21/76802 |
| | | | 257/700 |
| 8,970,045 B2* | 3/2015 | Sadaka | H01L 21/486 |
| | | | 257/774 |
| 9,054,160 B2* | 6/2015 | Bruce | H01L 23/5222 |
| 9,167,692 B2* | 10/2015 | Shimizu | H05K 1/115 |
| 9,220,167 B2* | 12/2015 | Shimizu | H05K 1/0298 |
| 9,252,096 B2* | 2/2016 | Hondo | H01L 23/49827 |
| 9,257,386 B2* | 2/2016 | Arisaka | H05K 1/0366 |
| 9,307,641 B2* | 4/2016 | Oi | H05K 1/111 |
| 9,318,452 B2* | 4/2016 | Chen | H01L 24/02 |
| 9,337,136 B2* | 5/2016 | Tseng | H01L 23/481 |
| 9,460,937 B2* | 10/2016 | Son | H01L 23/3128 |
| 9,520,352 B2* | 12/2016 | Arisaka | H05K 1/11 |
| 9,559,001 B2* | 1/2017 | Yen | H01L 21/76898 |
| 9,673,148 B2* | 6/2017 | Hu | H01L 21/565 |
| 9,681,546 B2* | 6/2017 | Sunohara | H01L 23/49822 |
| 9,763,319 B2* | 9/2017 | Inagaki | H05K 1/0313 |
| 9,788,433 B2* | 10/2017 | Lee | H05K 3/002 |
| 9,859,201 B2* | 1/2018 | Shimizu | H05K 1/09 |
| 9,875,957 B2* | 1/2018 | Shimizu | H01L 23/49822 |
| 9,960,120 B2* | 5/2018 | Fukasawa | H01L 23/5385 |
| 10,187,986 B2* | 1/2019 | Sunohara | H05K 3/4647 |
| 10,271,430 B2* | 4/2019 | Ishihara | H05K 1/113 |
| 10,485,098 B2* | 11/2019 | Miki | H05K 1/186 |
| 10,535,622 B2* | 1/2020 | Hu | H01L 21/4857 |
| 2011/0121445 A1* | 5/2011 | Mori | H01L 23/5389 |
| | | | 257/693 |
| 2015/0000958 A1* | 1/2015 | Harr | H05K 3/4647 |
| | | | 174/251 |
| 2016/0360609 A1* | 12/2016 | Lee | H05K 3/4682 |
| 2018/0114702 A1* | 4/2018 | Kodani | H01L 21/481 |

* cited by examiner

PACKAGE SUBSTRATE AND PACKAGE STRUCTURE

CROSS REFERENCE TO RELATED APPLICATION

This application claims the priority benefit of U.S. provisional application Ser. No. 62/512,731, filed on May 31, 2017. The entirety of the above-mentioned patent application is hereby incorporated by reference herein and made a part of the specification.

BACKGROUND OF THE INVENTION

1. Field of the Invention

The present invention relates to an electronic package technology, and more specifically relates to a package substrate and a package structure employing such the package substrate.

2. Description of Related Art

As the electronic industry has rapidly developed, the trend in electronic products has been to gradually move toward multi-functionality and high performance. One of the conventional structures of semiconductor packages has a semiconductor chip mounted on a package substrate which includes a core with symmetric built-up circuit structures.

In order to meet the demand for greater integration and miniaturization with higher densities of electronic components and wires, a package substrate with a finer interlayer connection is required to satisfy the operational requirements of integrated circuits with high circuit density. However, conventional types of package substrate using build-up circuit structures are not able to support such high-density wiring schemes. Therefore, fabricating a package substrate that has a high-density interconnection while keeping the manufacturing process simple has become a challenge to researchers in the field.

SUMMARY OF THE INVENTION

The invention provides a package substrate and a package structure having a reinforced high-density interconnection, thereby achieving a high quality of electrical signal transmission and low warpage with good mechanical stability.

The invention further provides a package substrate including a fine redistribution circuitry, a first redistribution circuitry disposed on the fine redistribution circuitry and a core disposed on the first redistribution circuitry opposite to the fine redistribution circuitry. The fine redistribution circuitry includes a fine conductive pattern. The first redistribution circuitry includes a first conductive pattern electrically connected to the fine conductive pattern. A thickness of the fine redistribution circuitry is less than a thickness of the first redistribution circuitry and a dimension of the fine conductive pattern is less than a dimension of the first conductive pattern. The core is electrically connected to the first conductive pattern. The Young's modulus of the core is greater than the Young's modulus of the first redistribution circuitry.

The invention further provides a package structure including the aforementioned package substrate and a semiconductor chip. The semiconductor chip is disposed on the fine redistribution circuitry opposite to the first redistribution circuitry. The semiconductor chip is electrically connected to the fine redistribution circuitry.

The invention further provides a package structure including the aforementioned package substrate and a semiconductor chip. The aforementioned package substrate further includes a second redistribution circuitry disposed on the core opposite to the first redistribution circuitry. The second redistribution circuitry includes a second conductive pattern electrically connected to the core. A thickness of the fine redistribution circuitry is less than a thickness of the second redistribution circuitry and a dimension of the fine conductive pattern is less than a dimension of the second conductive pattern. The semiconductor chip is disposed on the fine redistribution circuitry opposite to the first redistribution circuitry. The semiconductor chip is electrically connected to the fine redistribution circuitry.

Based on the above, the package substrate includes the fine redistribution circuitry and the first redistribution circuitry directly connected to the fine redistribution circuitry without the aid of foreign materials such as solders, thereby achieving a robust electronic package interconnection structure for high quality electrical signal transmission. In addition, the Young's modulus of the core is greater than the Young's modulus of the first redistribution circuitry to reinforce the mechanical stability of the package substrate.

To make the above features and advantages of the present invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 1A:
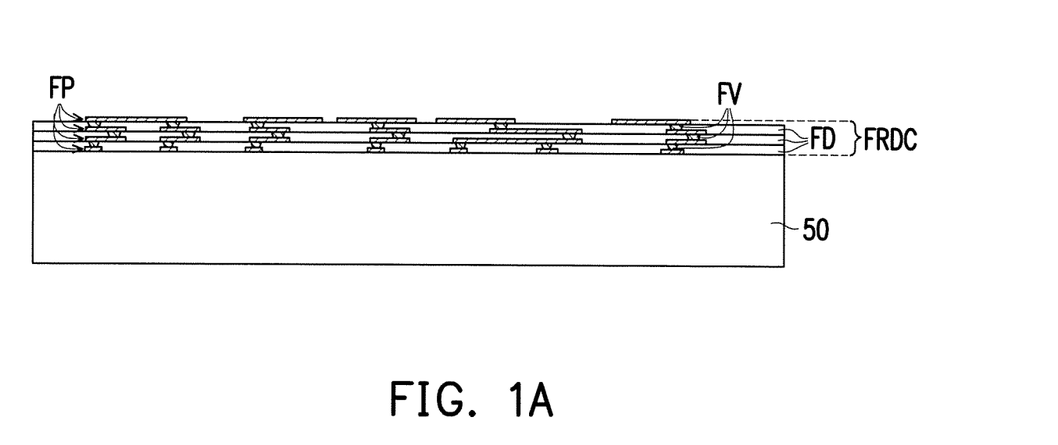
FIGS. 1A to 1E are schematic cross-sectional views illustrating a manufacturing method of a package substrate according to an embodiment of the invention.
Figure 1B:
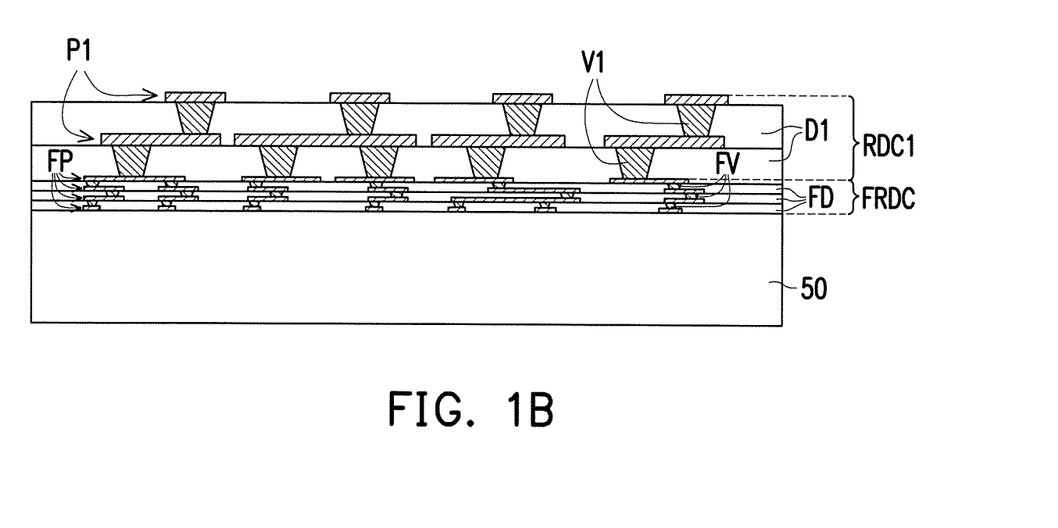
Figure 1C:
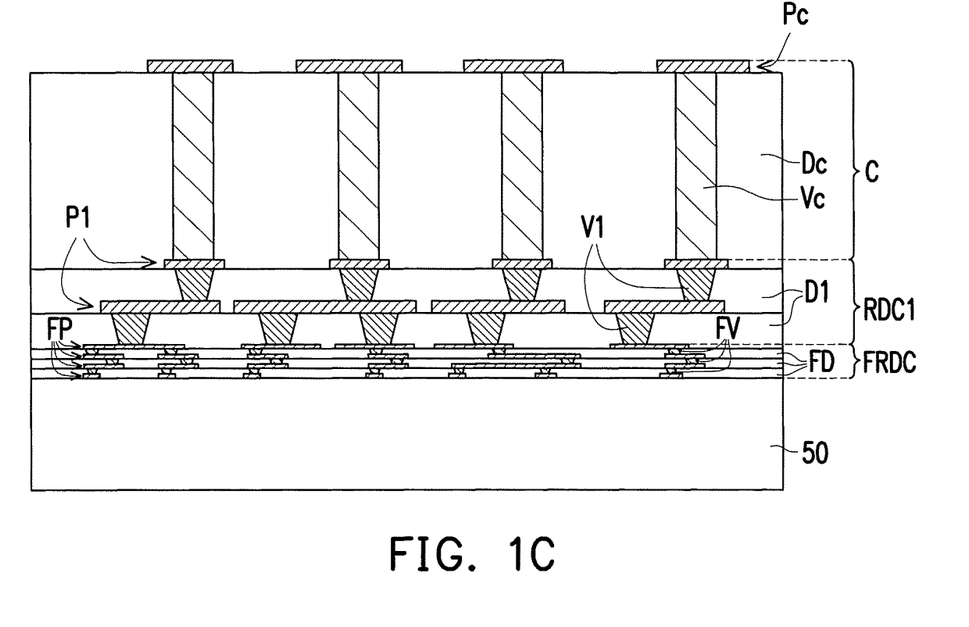
Figure 1D:
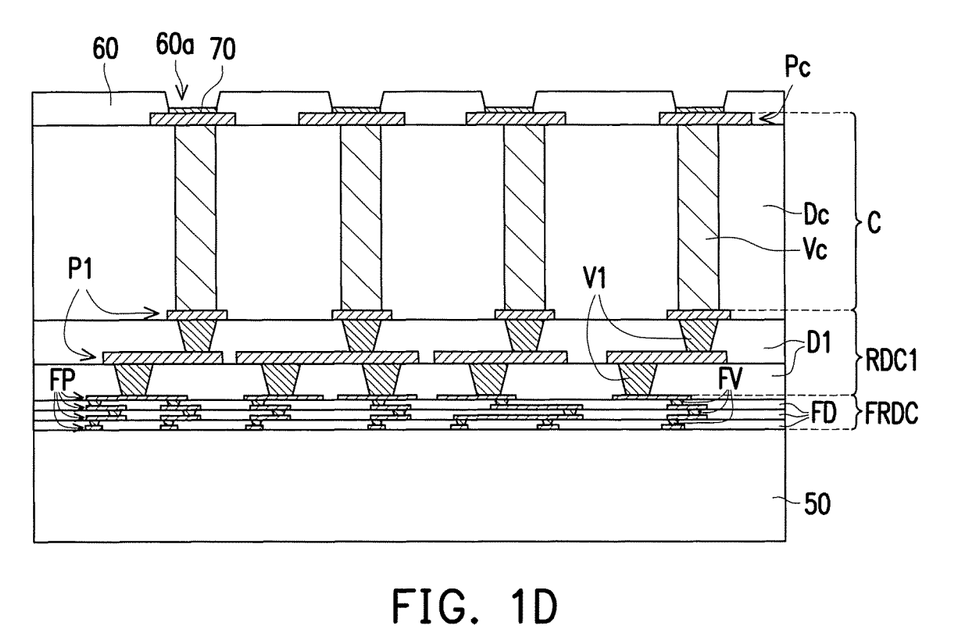
Figure 1E:
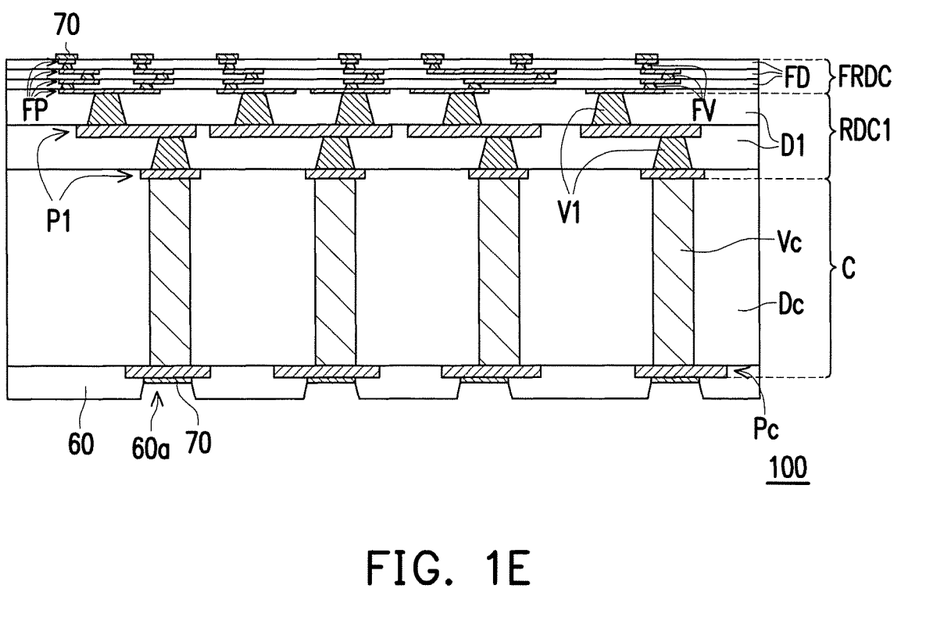
Figure 2:
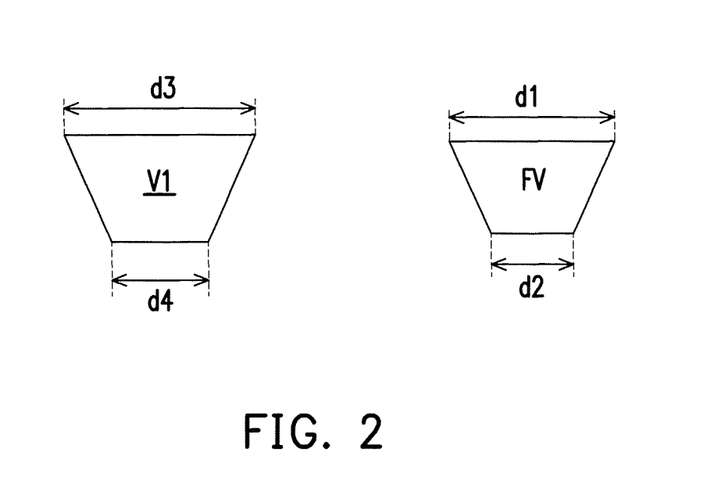
FIG. 2 is a schematic cross-sectional view illustrating a fine conductive via and a first conductive via according to an embodiment of the invention.

The following describes a manufacturing method of a package substrate with reference to FIGS. 1A to 2. FIGS. 1A to 1E are schematic cross-sectional views illustrating a manufacturing method of a package substrate according to an embodiment of the invention. FIG. 2 is a schematic cross-sectional view illustrating a fine conductive via and a first conductive via according to an embodiment of the invention. Referring to FIG. 1A first, a fine redistribution circuitry FRDC including a fine conductive pattern FP, a fine dielectric layer FD and a fine conductive via FV is formed on a temporary carrier 50. In some embodiments, the fine conductive pattern FP is stacked on the fine dielectric layer FD. The temporary carrier 50 may be made of glass, plastic or other suitable materials as long as the material is able to withstand the subsequent processes while carrying a structure formed thereon. In some embodiments, a release layer (not shown) may be applied on a top surface of the temporary carrier 50 to enhance the releasibility of the fine redistribution circuitry FRDC from the temporary carrier 50 in a subsequent process.

For example, the fine conductive pattern FP may be formed on the temporary carrier 50 using a deposition process, a lithography process and an etching process, or other suitable processes. The fine conductive pattern FP may be a patterned conductive layer with fine line/space routing. Next, the fine dielectric layer FD including a plurality of openings may be formed over the temporary carrier 50 to cover the fine conductive pattern FP using, for example, a coating process, a photolithography and an etching process, or other suitable processes. The openings of the fine dielectric layer FD may expose at least the portion of the fine conductive pattern FP for electrical connection. Subsequently, a plurality of the fine conductive vias FV may be formed in the openings of the fine dielectric layer FD and connect to the fine conductive patterns FP. In some embodiments, the fine conductive vias FV and the fine conductive patterns FP may be formed in the same process. The abovementioned steps may be performed multiple times such that the fine conductive patterns FP and the fine dielectric layers FD are alternatively stacked. In such embodiments, the fine conductive vias FV may be formed to connect between the fine conductive patterns FP in different layers to obtain a multi-layered redistribution circuitry as required by the circuit design. The topmost fine conductive pattern FP may be disposed on the fine dielectric layer FD for further electrical connection as shown in FIG. 1A. In other words, the fine redistribution circuitry FRDC can be a stack of layers having fine line/space routing. In some embodiments, the fine dielectric layer FD may be formed before the fine conductive pattern FP. That is, there is no limitation in the present disclosure as to the forming sequence of the fine conductive pattern FP and the fine dielectric layer FD.

Referring to FIG. 1B, a first redistribution circuitry RDC1 is disposed on the fine redistribution circuitry FRDC. A thickness of the fine redistribution circuitry FRDC is less than a thickness of the first redistribution circuitry RDC1. The first redistribution circuitry RDC1 includes a first conductive pattern P1, a first dielectric layer D1 and a first conductive via V1 disposed in the first dielectric layer D1. The first conductive via V1 is disposed on the topmost layer of the fine conductive pattern FP and electrically connected to the first conductive pattern P1. The first conductive pattern P1 may be electrically connected to the fine conductive pattern FP through the first conductive via V1 and stacked on the first dielectric layer D1.

For example, the first dielectric layer D1 including a plurality of openings may be formed over the topmost layer of the fine conductive pattern FP using a deposition process, a lithography process and an etching process, or other suitable processes. The openings of the first dielectric layer D1 may expose at least the portion of the topmost layer of the fine conductive pattern FP for electrical connection. Next, a plurality of the first conductive vias V1 may be formed in the openings of the first dielectric layer D1 to connect to the fine conductive pattern FP. The first conductive pattern P1 may be formed on the first conductive vias V1 to electrically connect to the fine redistribution circuitry FRDC. In some embodiments, the first conductive vias V1 and first conductive pattern P1 are formed in the same process. The first conductive pattern P1 may be a patterned conductive layer with coarse line/space routing. In some embodiments, the first dielectric layer D1 may be subsequently formed over the first conductive pattern P1 and the openings of the first dielectric layer D1 may expose at least the portion of the first conductive pattern P1 to form the first conductive vias V1. The abovementioned steps may be performed multiple times such that the first conductive patterns P1 and the first dielectric layers D1 are alternatively stacked. In such embodiments, the first conductive vias V1 may be formed to connect between the fine conductive pattern FP and the first conductive pattern P1 and also between the first conductive patterns P1 in different layers to obtain a multi-layered redistribution circuitry as shown in FIG. 1B.

A dimension of the fine conductive pattern FP is less than a dimension of the first conductive pattern P1. For example, the line/space of the fine conductive pattern FP is finer than the line/space of the first conductive pattern P1. In some embodiments, a thickness of the fine dielectric layer FD is less than a thickness of the first dielectric layer D1. In some embodiments, each of the fine conductive vias FV is tapered in a direction toward the temporary carrier 50. For example, an outer diameter d1 of one end of the fine conductive via FV facing towards the first redistribution circuitry RDC1 is greater than an outer diameter d2 of another end of the fine conductive via FV facing away from the first redistribution circuitry RDC1 as shown in FIGS. 1B and 2. In some embodiments, each of the first conductive vias V1 is tapered in a direction toward the fine redistribution circuitry FRDC. For example, an outer diameter d3 of one end of the first conductive via V1 facing away from the fine redistribution circuitry FRDC is greater than an outer diameter d4 of another end of the first conductive via V1 facing toward the fine redistribution circuitry FRDC as shown in FIGS. 1B and 2. In some embodiments, each of the first conductive vias V1 has a trapezoid shape with wide top and narrow bottom in a cross-sectional view. The size of each of the first conductive vias V1 is greater than the size of each of the fine conductive vias FV.

Referring to FIG. 1C, a core C is disposed on the first redistribution circuitry RDC1 opposite to the fine redistribution circuitry FRDC and electrically connected to the first conductive pattern P1. The Young's modulus of the core C is greater than the Young's modulus of the first redistribution circuitry RDC1. In some embodiments, the core C may include materials such as pre-preg, ceramic, metal, or other suitable materials. For example, the core C includes a core dielectric layer Dc, a core conductive pattern Pc and a through conductive via Vc (also known as a through hole). For example, a plurality of the through conductive vias Vc is embedded in the core dielectric layer Dc and electrically connected to the first redistribution circuitry RDC1. The core conductive pattern Pc is disposed on the core dielectric layer Dc opposite to the first redistribution circuitry RDC1 and electrically connected to the through conductive vias Vc.

In some embodiments, the core dielectric layer Dc having a plurality of openings may be formed over the first redistribution circuitry RDC1 and the openings of the core dielectric layer Dc may expose the topmost layer of the first conductive pattern P1. Next, the through conductive vias Vc may be formed in the openings of the core dielectric layer Dc to couple to the topmost layer of the first conductive pattern P1. Subsequently, the core conductive pattern Pc may be formed on the core dielectric layer Dc to couple to the through conductive vias Vc. In some embodiments, the through conductive vias Vc may be formed before the core dielectric layer Dc. That is, there is no limitation in the present disclosure as to the forming sequence of the core dielectric layer Dc and the through conductive vias Vc.

One property of a material to consider is the stiffness of the material, which can be expressed as Young's Modulus. The Young's modulus of the core dielectric layer Dc is greater than the Young's modulus of the first dielectric layer D1 of the first redistribution circuitry RDC1 and is also greater than the fine dielectric layer FD of the fine redistribution circuitry FRDC. In other words, the material of the core dielectric layer Dc is stiffer than the material of the first dielectric layer D1 and the material of the fine dielectric layer FD. In some embodiments, the thickness of the first dielectric layer D1 is less than a thickness of the core dielectric layer Dc. A thickness of the core C may be determined by the Young's modulus or stiffness of the core dielectric layer Dc, however the thickness of the core C is not limited thereto. For example, the core C with a higher stiffness may be thinner while still maintaining the stability of the structure. In other words, the core C with a higher Young's modulus than the dielectric layers in the interconnection structure is used to reinforce the mechanical stability of the package.

Another material property to consider is the coefficient of thermal expansion (CTE). In some embodiments, the materials for the core dielectric layer Dc may have a CTE in proximity to or substantially equal to that of a silicon-based die (about 2.7 ppm) which is to be mounted on the core C. In some embodiments, a CTE of the first dielectric layer D1 of the first redistribution circuitry RDC1 is greater than the CTE of the core dielectric layer Dc.

Referring to FIG. 1D, a passivation layer 60 is disposed on the core C opposite to the first redistribution circuitry RDC1. The passivation layer 60 may have at least one opening 60a exposing a portion of the core conductive pattern Pc. The portion of the core conductive pattern Pc may serve as the electrical contact pads. In some embodiments, the core conductive pattern Pc is used for a ball mount. For example, the passivation layer 60 may be a solder mask, or may include inorganic materials or other suitable insulating materials. In some embodiments, a plurality of surface finishing layers 70 may be disposed in the openings 60a of the passivation layer 60 and on portions of the core conductive pattern Pc exposed by the openings 60a to inhibit oxidation. In some embodiments, the surface finishing layers 70 are disposed on the core conductive pattern Pc for protection and solderability.

Referring to FIG. 1E, the temporary carrier 50 may be removed from the fine redistribution circuitry FRDC by applying external energy between the fine redistribution circuitry FRDC and the temporary carrier 50 to peel off the release layer or by using other suitable processes to remove the temporary carrier 50. In some embodiments, after removing the temporary carrier 50, the fine conductive pattern FP is exposed and then the surface finishing layers 70 may be formed on the exposed fine conductive pattern FP for protection. The manufacturing process of a package substrate 100 is then substantially complete. The package substrate 100 includes the core conductive pattern Pc and the fine conductive pattern FP respectively exposed from the passivation layer 60 and the fine dielectric layer FD for further electrical connection.

Figure 3A:
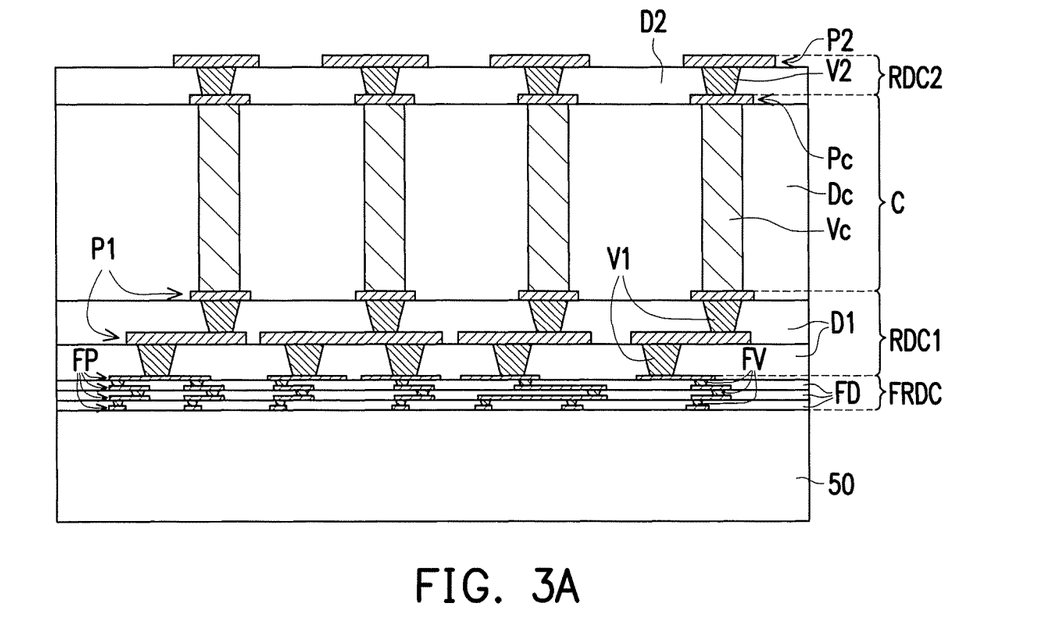
FIGS. 3A to 3C are schematic cross-sectional views illustrating a manufacturing method of a package substrate according to an embodiment of the invention.
Figure 3B:
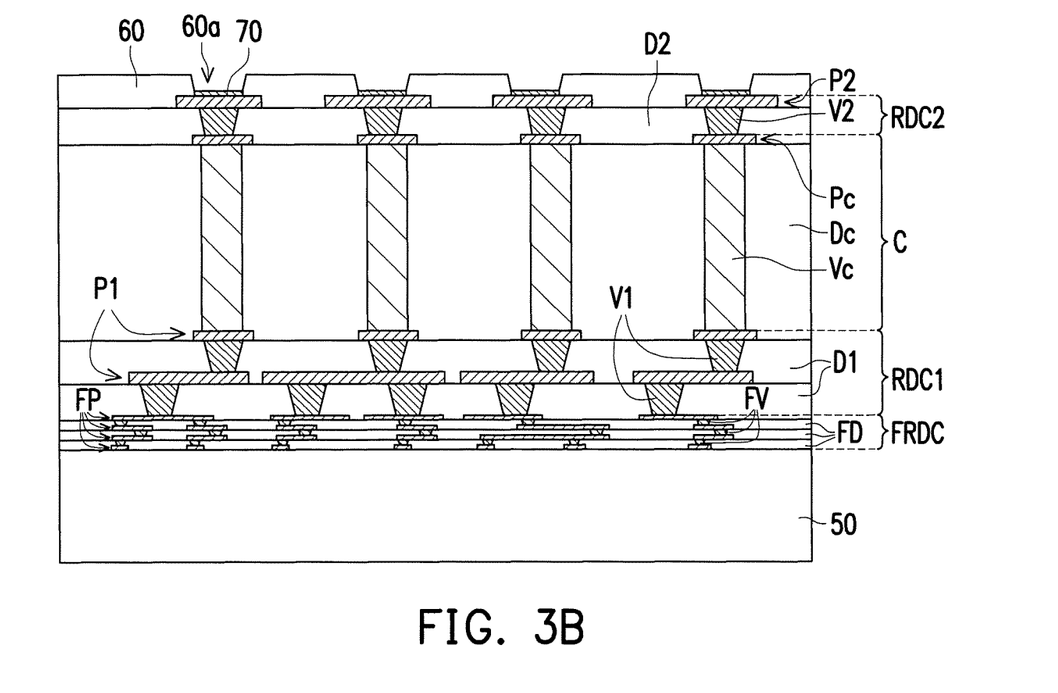
Figure 3C:
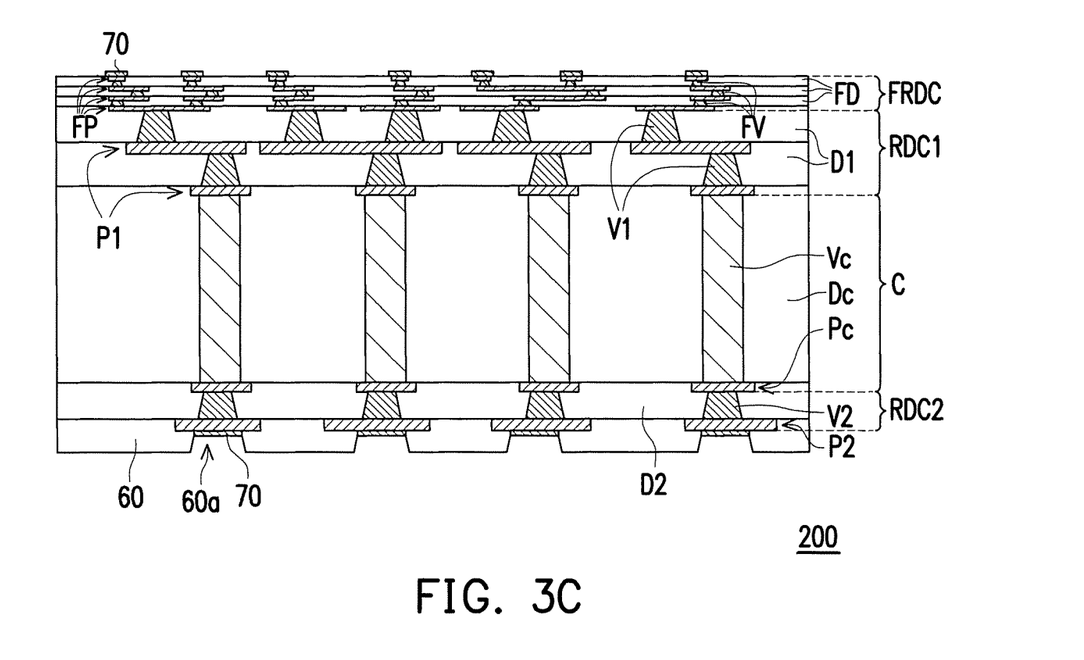

FIGS. 3A to 3C are schematic cross-sectional views illustrating a manufacturing method of a package substrate according to an embodiment of the invention. The manufacturing method of the present embodiment is similar to that of the embodiment illustrated in FIGS. 1A to 1E. Identical or similar numbers refer to identical or similar elements throughout the drawings, and already described detail thereof is not repeated here. The difference between the present embodiment and the abovementioned embodiment illustrated in FIGS. 1A to 1E lies in that after forming the core C, a second redistribution circuitry RDC2 is formed on the core C opposite to the first redistribution circuitry RDC1.

Referring to FIG. 3A, the second redistribution circuitry RDC2 includes a second conductive pattern P2, a second dielectric layer D2 disposed on the core C and a second conductive via V2 disposed on the core conductive pattern Pc. The second conductive pattern P2 may be stacked on the second dielectric layer D2. The second conductive pattern P2 is electrically connected to the core C through the second conductive via V2. The forming process of the second redistribution circuitry RDC2 may be similar to the forming process of the first redistribution circuitry RDC1 and the detailed descriptions are omitted herein for brevity. The second dielectric layer D2 and the second conductive pattern P2 may be alternatively stacked to obtain a multi-layered redistribution circuitry as required by the circuit design. In some embodiments, the amount of the stacked layers of the first dielectric layer D1 may be greater than the amount of the stacked layers of the second dielectric layer D2. In some other embodiments, the amount of the stacked layers of the first dielectric layer D1 may be equal to or less than the amount of the stacked layers of the second dielectric layer D2 depending on the design requirements. In some embodiments, the number of the stacked layers of the first conductive patterns P1 in the first redistribution circuitry RDC1 is greater than the number of the stacked layers of the second conductive patterns P2 in the second redistribution circuitry.

In some embodiments, each of the second conductive vias V2 is tapered in a direction toward the core C. In other words, the second conductive vias V2 and the first conductive vias V1 are tapered in the same direction toward the fine redistribution circuitry FRDC. For example, an outer diameter of one end of the second conductive via V2 facing away from the core C is greater than an outer diameter of another end of the second conductive via V2 facing toward the core C. In some embodiments, each of the second conductive vias V2 has a trapezoid shape with wide top and narrow bottom in a cross-sectional view. The size of the second conductive via V2 may be similar to the size of the first conductive via V1 as shown in FIG. 3A. The size of each of the second conductive vias V2 is greater than the size of each of the fine conductive vias FV. The line and space of the fine conductive pattern FP are finer than the line and space of the second conductive pattern P2. The Young's modulus of the core dielectric layer Dc may be greater than the Young's modulus of the second dielectric layer D2 of the second redistribution circuitry RDC2. A thickness of the second dielectric layer D2 may be less than a thickness of the core dielectric layer Dc. In some embodiments, a CTE of the second dielectric layer D2, as well as the CTE of the first dielectric layer D1, is greater than the CTE of the core dielectric layer Dc.

Referring to FIG. 3B, the passivation layer 60 is disposed on the second redistribution circuitry RDC2 opposite to the core C. The passivation layer 60 may have at least one opening 60a exposing a portion of the second conductive pattern P2. In some embodiments, the surface finishing layers 70 may be respectively disposed in the openings 60a of the passivation layer 60 and respectively disposed on portions of the second conductive pattern P2 exposed by the openings 60a.

Referring to FIG. 3C, the temporary carrier 50 may be removed from the fine redistribution circuitry FRDC to expose the fine conductive pattern FP. In some embodiments, after removing the temporary carrier 50, the fine conductive pattern FP is exposed and then the surface finishing layers 70 may be formed on the exposed fine conductive pattern FP for protection. The manufacturing process of a package substrate 200 is then substantially complete. The package substrate 200 includes the second conductive pattern P2 and the fine conductive pattern FP for further electrical connection.

In some embodiments, a thickness of the fine redistribution circuitry FRDC is less than a thickness of the second redistribution circuitry RDC2, and a dimension of the fine conductive pattern FP is less than a dimension of the second conductive pattern P2.

Figure 4:
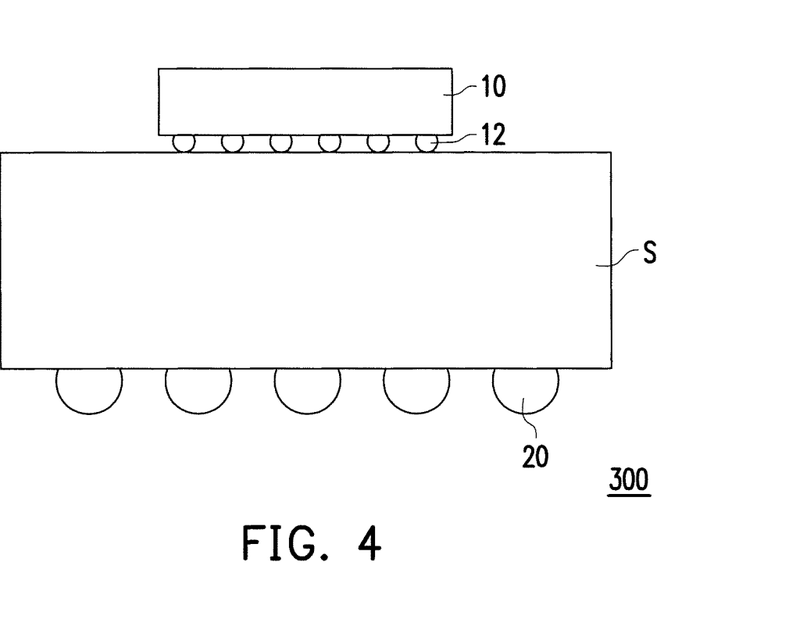
FIG. 4 is a schematic cross-sectional view illustrating a package structure according to an embodiment of the invention.

FIG. 4 is a schematic cross-sectional view illustrating a package structure according to an embodiment of the invention. For example, a package structure 300 includes a package substrate S and a semiconductor chip 10. The package structure 300 may further include at least one conductive terminal 20. In some embodiments, the portions of the outermost layer of the fine conductive pattern FP connected to the semiconductor chip 10 are bump pads. For example, a plurality of conductive bumps 12 disposed on the active surface of the semiconductor chip 10 can be used to electrically connect the package substrate S to the semiconductor chip 10. As semiconductor structures become more advanced, the need for higher input/output density leads to a tighter bump pitch. The fine redistribution circuitry FRDC of the package substrate S (e.g. package substrate 100 in FIG. 1E or 200 in FIG. 3C) meets the fine line and space requirements of such high bump density of flip chips.

For example, the package substrate S may be provided as the package substrate 100 shown in FIG. 1E. The semiconductor chip 10 is disposed on the fine redistribution circuitry FRDC opposite to the first redistribution circuitry RDC1 using the flip-chip technique to electrically connect the fine redistribution circuitry FRDC to the semiconductor chip 10. In some embodiments, the fine redistribution circuitry FRDC and the first redistribution circuitry RDC1 can be used for redistribution as well as for power/ground circuit distribution. The conductive terminals 20 may be disposed on the core C opposite to the semiconductor chip 10 and electrically connected to the semiconductor chip 10 through the core C. As such, the package structure 300 has a short electrical conduction path from the semiconductor chip 10 to the conductive terminals 20 for better circuit performance.

In some other embodiments, the package substrate S may be provided as the package substrate 200 shown in FIG. 3C. The semiconductor chip 10 may be disposed on the fine redistribution circuitry FRDC opposite to the second redistribution circuitry RDC2, and the semiconductor chip 10 is electrically connected to the fine redistribution circuitry FRDC. The conductive terminals 20 may be disposed on the second redistribution circuitry RDC2 opposite to the semiconductor chip 10 and electrically connected to the semiconductor chip 10 through the second redistribution circuitry RDC2.

Further to that described above, the first redistribution circuitry directly is connected to the fine redistribution circuitry without the aid of foreign materials such as solders, thereby keeping the electrical conduction path through the package substrate short and achieving a robust electronic package interconnection structure for high quality electrical signal transmission. In addition, the Young's modulus of the core is greater than the Young's modulus of the redistribution circuitry (e.g. the first, the second and the fine redistribution circuitry) to reinforce the mechanical stability of the package substrate. The package substrate includes a layered structure with the first and second dielectric layers and having CTEs higher than that of the core and the core having a high Young's modulus, which result in the package substrate having a lower warpage when coupled to the semiconductor chip, and therefore being more reliable.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:
1. A package substrate comprising:
a fine redistribution circuitry comprising a fine conductive pattern and a fine conductive via, wherein the fine conductive via is electrically connected to the fine conductive pattern;
a first redistribution circuitry disposed on the fine redistribution circuitry, the first redistribution circuitry comprising:
a first conductive pattern electrically connected to the fine conductive pattern, wherein a line of the fine conductive pattern is finer than a line of the first conductive pattern;
a first dielectric layer, the first conductive pattern being stacked on the first dielectric layer; and
a first conductive via disposed on the fine conductive pattern and in the first dielectric layer, electrically connected to the first conductive pattern, wherein the first conductive via is tapered in a direction toward the fine redistribution circuitry and an outer diameter of one end of the first conductive via facing away from the fine redistribution circuitry is greater than an outer diameter of another end of the first conductive via facing toward the fine redistribution circuitry, wherein a size of the first conductive via is greater than a size of the fine conductive via;
a core disposed on the first redistribution circuitry opposite to the fine redistribution circuitry and electrically connected to the first conductive pattern, wherein the Young's modulus of the core is greater than the Young's modulus of the first redistribution circuitry, wherein the core comprises:
a core dielectric layer; and
a through conductive via embedded in the core dielectric layer and electrically connected to the first redistribution circuitry; and
a second redistribution circuitry disposed on the core opposite to the first redistribution circuitry, the second redistribution circuitry comprising:
a second conductive pattern electrically connected to the core;
a second dielectric layer disposed on the core, the second conductive pattern being stacked on the second dielectric layer; and
a second conductive via disposed in the second dielectric layer and electrically connected to the second conductive pattern, wherein the line of the fine conductive pattern is finer than a line of the second conductive pattern, a size of the second conductive via is greater than the size of the fine conductive via, wherein the number of the first dielectric layer of the first redistribution circuitry is not equal to the number of the second dielectric layer of the second redistribution circuitry, and the number of the first dielectric layer of the first redistribution circuitry is greater than the number of the second dielectric layer of the second redistribution circuitry, wherein a plurality of the first conductive patterns are disposed in a stacked-layer manner in the first redistribution circuitry, a plurality of the second conductive patterns are disposed in a stacked-layer manner in the second redistribution circuitry, and the number of the stacked layers of the first conductive patterns is greater than the number of the stacked layers of the second conductive patterns.

2. The package substrate according to claim 1, wherein an outer diameter of one end of the first conductive via facing away from the fine redistribution circuitry is greater than an outer diameter of another end of the first conductive via facing toward the fine redistribution circuitry.

3. The package substrate according to claim 1, wherein the fine redistribution circuitry comprises a fine dielectric layer, the fine conductive pattern is stacked on the fine dielectric layer, and a thickness of the fine dielectric layer is less than a thickness of the first dielectric layer.

4. The package substrate according to claim 1, wherein the thickness of the first dielectric layer of the first redistribution circuitry is less than a thickness of the core dielectric layer.

5. The package substrate according to claim 4, wherein the Young's modulus of the core dielectric layer is greater than the Young's modulus of the first dielectric layer of the first redistribution circuitry.

6. The package substrate according to claim 4, wherein a coefficient of thermal expansion of the core dielectric layer is substantially equal to a coefficient of thermal expansion of silicon.

7. The package substrate according to claim 4, wherein a coefficient of thermal expansion of the first dielectric layer of the first redistribution circuitry is greater than a coefficient of thermal expansion of the core dielectric layer.

8. The package substrate according to claim 1, wherein the core further comprises:
a core conductive pattern disposed on the core dielectric layer opposite to the first redistribution circuitry and electrically connected to the through conductive via.

9. The package substrate according to claim 8, further comprising:
a passivation layer disposed on the core opposite to the first redistribution circuitry and having at least one opening, wherein the at least one opening exposes a portion of the core conductive pattern.

10. The package substrate according to claim 9, further comprising:
a surface finishing layer disposed in the at least one opening of the passivation layer and on the portion of the core conductive pattern exposed by the at least one opening.

11. The package substrate according to claim 8, wherein the second redistribution circuitry further comprises:
the second conductive via disposed on the core conductive pattern, wherein the second conductive via is tapered in a direction toward the core.

12. The package substrate according to claim 11, wherein an outer diameter of one end of the second conductive via facing away from the core is greater than an outer diameter of another end of the second conductive via facing toward the core.

13. The package substrate according to claim 1, further comprising:
a passivation layer disposed on the second redistribution circuitry opposite to the core and having at least one opening, wherein the at least one opening exposes a portion of the second conductive pattern.

14. The package substrate according to claim 13, further comprising:
a surface finishing layer disposed in the at least one opening of the passivation layer and on the portion of the second conductive pattern exposed by the at least one opening.

15. A package structure, comprising:
a package substrate according to claim 1; and
a semiconductor chip disposed on the fine redistribution circuitry opposite to the first redistribution circuitry, wherein the semiconductor chip is electrically connected to the fine redistribution circuitry.

16. The package structure according to claim 15 further comprising:
at least one conductive terminal disposed on the core opposite to the semiconductor chip, wherein the at least one conductive terminal is electrically connected to the semiconductor chip through the core.

17. A package structure, comprising:
a package substrate according to claim 1; and
a semiconductor chip disposed on the fine redistribution circuitry opposite to the second redistribution circuitry, wherein the semiconductor chip is electrically connected to the fine redistribution circuitry.

18. The package structure according to claim 17 further comprising:
at least one conductive terminal disposed on the second redistribution circuitry opposite to the semiconductor chip, wherein the at least one conductive terminal is electrically connected to the semiconductor chip through the second redistribution circuitry.

* * * * *